United States Patent
Deng et al.

(10) Patent No.: US 9,054,705 B2
(45) Date of Patent: Jun. 9, 2015

(54) SELF-POWERED SOURCE DRIVING CIRCUIT AND SWITCHING POWER SUPPLY THEREOF

(71) Applicant: Silergy Semiconductor Technology (Hangzhou) LTD, Hangzhou, ZheJiang Province (CN)

(72) Inventors: Jian Deng, Hangzhou (CN); Guojia Liu, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 80 days.

(21) Appl. No.: 14/030,110

(22) Filed: Sep. 18, 2013

(65) Prior Publication Data

US 2014/0167724 A1    Jun. 19, 2014

(30) Foreign Application Priority Data

Nov. 5, 2012  (CN) .......................... 2012 1 0435979

(51) Int. Cl.
   *G05F 3/18*     (2006.01)
   *H03K 17/30*    (2006.01)
   *H02M 1/08*     (2006.01)
   *H02M 3/158*    (2006.01)
   *H02M 1/00*     (2006.01)

(52) U.S. Cl.
   CPC ............... *H03K 17/302* (2013.01); *H02M 1/08* (2013.01); *H02M 3/158* (2013.01); *H02M 2001/0006* (2013.01)

(58) Field of Classification Search
   CPC ............. G05F 1/56; G05F 3/24; G05F 3/156; G05F 3/167; G05F 3/1588; G05F 3/18; G05F 3/20; G05F 3/22; G05F 3/30; H02M 3/335; H02M 3/33507; H02M 3/33569
   USPC ................. 323/265, 282, 283, 311–314, 351; 363/20, 21.04, 21.1, 21.12, 21.18
   See application file for complete search history.

(56) References Cited

U.S. PATENT DOCUMENTS

| | | | | |
|---|---|---|---|---|
| 4,933,830 | A * | 6/1990 | Sato et al. ..................... 363/131 |
| 5,528,481 | A * | 6/1996 | Caldeira et al. ................. 363/20 |
| 6,775,164 | B2 * | 8/2004 | Wong et al. .................... 363/147 |
| 7,138,786 | B2 * | 11/2006 | Ishigaki et al. ............... 323/224 |
| 2007/0159150 | A1 * | 7/2007 | Hosokawa et al. ........... 323/285 |

FOREIGN PATENT DOCUMENTS

CN          101282088 A      5/2008

\* cited by examiner

*Primary Examiner* — Adolf Berhane
(74) *Attorney, Agent, or Firm* — Michael C. Stephens, Jr.

(57) ABSTRACT

In one embodiment, a source driving circuit configured for a switching power circuit, can include: (i) a source transistor coupled between a source of a main power transistor and ground, where the source transistor can be controlled by a PWM control signal; (ii) the main power transistor being on when the source transistor is on and a gate-source voltage of the main power transistor exceeds a conduction threshold voltage; (iii) a source diode having an anode coupled to the main power transistor source, and a cathode coupled to a delay circuit and a power supply capacitor; and (iv) the delay circuit controlling the main power transistor to turn off a delay time after the source transistor is turned off, where the delay time allows charging of the power supply capacitor such that a voltage across the power supply capacitor is at least a level of a reference voltage.

11 Claims, 9 Drawing Sheets

SELF-POWERED SOURCE DRIVING CIRCUIT AND SWITCHING POWER SUPPLY THEREOF

RELATED APPLICATIONS

This application claims the benefit of Chinese Patent Application No. 201210435979.6, filed on Nov. 5, 2012, which is incorporated herein by reference in its entirety.

FIELD OF THE INVENTION

The present invention relates to the field of power supplies, and more particularly to self-powered source driving circuits and switching power supplies.

BACKGROUND

In switching power supplies, source driving is widely used because of relatively low energy consumption and high efficiency. In source driving, the gate voltage of a main power transistor may be fixed at a certain value, and the main power transistor can be controlled by changing the source voltage of the main power transistor.

SUMMARY

In one embodiment, a source driving circuit configured for a switching power circuit, can include: (i) a source transistor coupled between a source of a main power transistor and ground, where the source transistor is configured to be controlled by a pulse-width modulation (PWM) control signal; (ii) the main power transistor being configured to be on when the source transistor is on and a gate-source voltage of the main power transistor exceeds a conduction threshold voltage; (iii) a source diode having an anode coupled to the main power transistor source, and a cathode coupled to a delay circuit and to a power supply capacitor; and (iv) the delay circuit being configured to control the main power transistor to turn off a delay time after the source transistor is turned off, where the delay time is configured to allow charging of the power supply capacitor such that a voltage across the power supply capacitor is at least a level of a reference voltage.

In one embodiment, a switching power circuit can include: (i) a power stage circuit having the main power transistor; (ii) a control circuit configured to generate the PWM control signal; (iii) the source driving circuit as above, where the source driving circuit is configured to drive the main power transistor in response to the PWM control signal; and (iv) the power supply capacitor being configured to supply voltage for the control circuit, where a voltage across the power supply capacitor is configured to be charged to the reference voltage that is an expected supply voltage of the control circuit.

Embodiments of the present invention can provide several advantages over conventional approaches, as may become readily apparent from the detailed description of preferred embodiments below.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
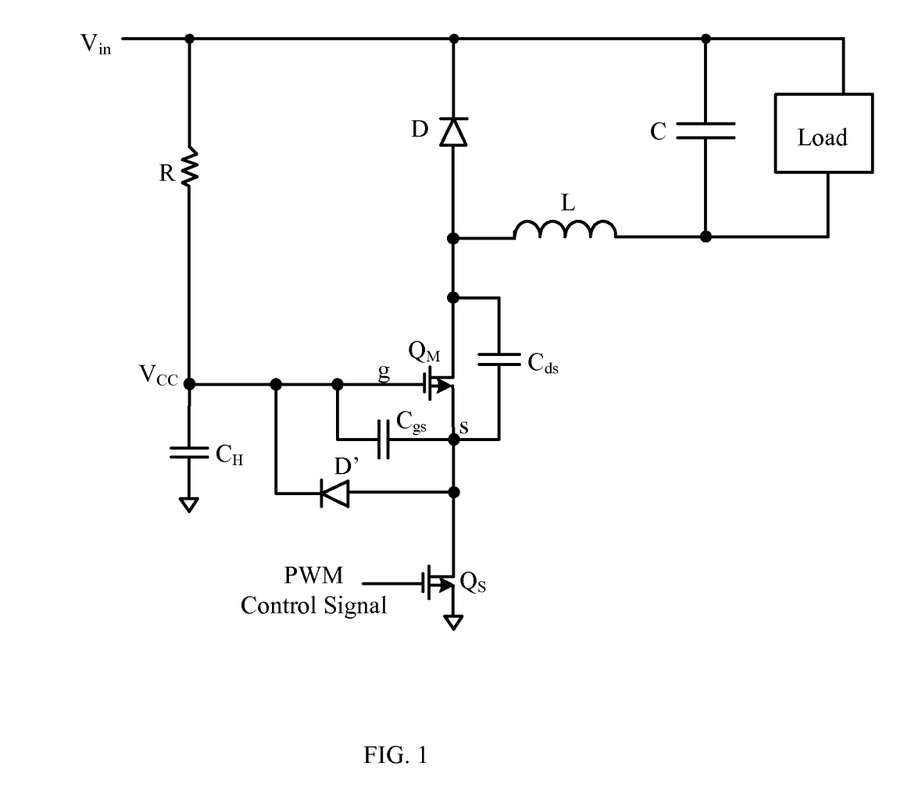
FIG. 1 is a schematic block diagram of an example conventional source driver.

FIG. 1 shows a schematic diagram of an example source driver. This example source driving circuit can include transistor $Q_S$, source diode D', and power supply capacitor $C_H$. One power terminal of transistor $Q_S$ can connect to the source of main power transistor $Q_M$, and the other power terminal of transistor $Q_S$ can connect to ground. One terminal of power supply capacitor $C_H$ can connect to a control terminal of main power transistor $Q_M$, and the other terminal of power supply capacitor $C_H$ can connect to ground. The positive terminal of source diode D' can connect to a common node of main power transistor $Q_M$ and transistor $Q_S$, and the negative terminal of source diode D' can connect to power supply capacitor $C_H$ and the control terminal of main power transistor $Q_M$.

Main power transistor $Q_M$ can be controlled according to the switching state of transistor $Q_S$. When transistor $Q_S$ is on, the source voltage of main power transistor $Q_M$ may drop, and when the gate-source voltage of main power transistor $Q_M$ reaches a level of a conduction threshold voltage, main power transistor $Q_M$ can be turned on. When transistor $Q_S$ is off, the source voltage of main power transistor $Q_M$ may rise, and when the gate-source voltage of main power transistor $Q_M$ is less than the conduction threshold voltage, main power transistor $Q_M$ can be turned off. The switching power supply can also include a control circuit for generating a pulse-width modulation (PWM) control signal to control a switching state of transistor $Q_S$. Power supply capacitor $C_H$ can be used, e.g., to supply voltage for the control circuit.

As shown in FIG. 1, when main power transistor $Q_M$ is off, the current of the power stage circuit can charge power supply capacitor $C_H$ through drain-source parasitic capacitor $C_{ds}$ of main power transistor $Q_M$ and source diode D'. However, when input voltage $V_{in}$ is relatively low, capacitor $C_{ds}$ of main power transistor $Q_M$ may also be relatively small. Thus, it may be difficult to ensure that power supply capacitor $C_H$ can be charged to a high enough voltage. It may also be difficult to supply a suitable supply voltage for the control circuit. Therefore, in order to supply voltage for the control circuit, an extra capacitor may be added between the drain and source of the main power transistor $Q_M$ to increase the capacitance of the parasitic capacitor. However, this can increase the energy used to charge power supply capacitor $C_H$ by the current of the power circuit when the main power transistor is off, and switching losses may be increased as a result.

In one embodiment, a source driving circuit configured for a switching power circuit, can include: (i) a source transistor coupled between a source of a main power transistor and ground, where the source transistor is configured to be controlled by a PWM control signal; (ii) the main power transistor being configured to be on when the source transistor is on and a gate-source voltage of the main power transistor exceeds a conduction threshold voltage; (iii) a source diode having an anode coupled to the main power transistor source, and a cathode coupled to a delay circuit and to a power supply capacitor; and (iv) the delay circuit being configured to control the main power transistor to turn off a delay time after the source transistor is turned off, where the delay time is configured to allow charging of the power supply capacitor such that a voltage across the power supply capacitor is at least a level of a reference voltage.

In one embodiment, a switching power circuit can include: (i) a power stage circuit having the main power transistor; (ii) a control circuit configured to generate the PWM control signal; (iii) the source driving circuit as above, where the source driving circuit is configured to drive the main power transistor in response to the PWM control signal; and (iv) the power supply capacitor being configured to supply voltage for the control circuit, where a voltage across the power supply capacitor is configured to be charged to the reference voltage that is an expected supply voltage of the control circuit.

Figure 2:
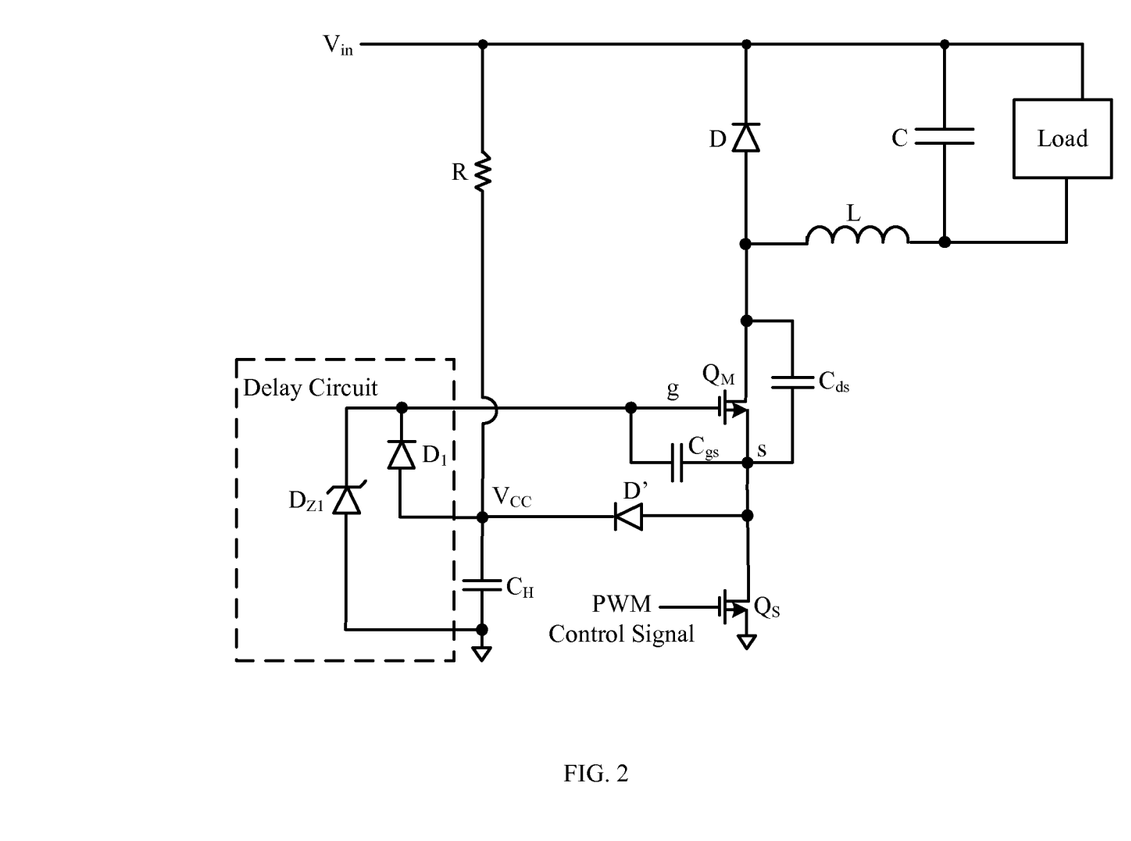
FIG. 2 is a schematic block diagram of a first example self-powered source driving circuit in accordance with embodiments of the present invention.

Referring now to FIG. 2, shown is a schematic block diagram of a first example self-powered source driving circuit in accordance with embodiments of the present invention. For example, the source driving circuit can be applied in a switching power supply, which may include a power stage circuit and a control circuit. Also, while the power stage circuits shown herein are primarily configured as buck topology, other supply topologies (e.g., flyback, boost, buck-boost, sepic, etc.) can also be supported in particular embodiments. The power stage circuit can include main power transistor $Q_M$. The source driving circuit can receive a PWM control signal output by a control circuit to drive main power transistor $Q_M$. For example, the source driving circuit can also include source transistor $Q_S$, source diode D', and power supply capacitor $C_H$. The PWM control signal can be used to control a switching state of source transistor $Q_S$.

Power supply capacitor $C_H$ can provide a supply voltage (e.g., $V_{CC}$) for the control circuit, which may be included or associated with the delay circuit. For example, the control circuit can be used to generate one or more control signals to control source transistors (e.g., $Q_S$), or other transistors, that may control a source voltage of main power transistor $Q_M$ and/or discharge and/or delay paths between control timing of source transistor and main power transistor $Q_M$. The control circuit may be part of, or associated with, the source driver (e.g., to control source transistor $Q_S$) and/or a delay circuit. Generally, the gate of main power transistor $Q_M$ can be relatively fixed during some phases of operation, while the source of main power transistor $Q_M$ can be controlled (e.g., via a PWM control signal) in order to provide regulation via the power stage. Also, particular embodiments can control the timing, such as the turn on/turn off timing of transistors $Q_M$ and $Q_S$, and may utilize the control circuit for such purposes. Further, the control circuit included in the source driver may be self-powered by utilizing the supply voltage across power supply capacitor $C_H$.

In particular embodiments, the source driving circuit can also include a delay circuit that can effectively generate a delay time. After transistor $Q_S$ is turned off, the delay circuit can be used to control main power transistor $Q_M$ to turn off after a delay time has elapsed. This can allow sufficient time for power supply capacitor $C_H$ to be charged at least to a level of a reference voltage ($V_{REF}$). For example, the reference voltage can be configured as an expected supply voltage of the control circuit (not shown). In other cases, the reference voltage can be configured as a minimum control circuit, or other circuit, supply voltage.

In this example, the delay circuit can include zener diode $D_{Z1}$ and diode $D_1$. A zener diode is a diode that allows current to flow in the forward direction, but also permits current to flow in the reverse direction when the voltage across the zener diode is above a certain value known as the breakdown voltage, "zener knee voltage", "zener voltage," or "avalanche point." The negative terminal of zener diode $D_{Z1}$ can connect to the control terminal of main power transistor $Q_M$, and the positive terminal of zener diode $D_{Z1}$ can connect to ground. The negative terminal of diode $D_1$ can connect to a common node of the negative terminal of the zener diode and the control terminal of main power transistor $Q_M$, and the positive terminal of diode $D_1$ can connect to a common node of power supply capacitor $C_H$ and source diode D'. For example, the breakdown voltage of zener diode $D_{Z1}$ can be a sum of an expected supply voltage of the control circuit and a conduction threshold voltage of main power transistor $Q_M$.

When source transistor $Q_S$ is off, because power supply capacitor $C_H$ may be connected to the gate electrode of main power transistor $Q_M$ through diode $D_1$, the gate voltage of main power transistor $Q_M$ can be approximately equal to $V_{CC}$, or within a diode drop of $V_{CC}$. When the control circuit controls source transistor $Q_S$ to be turned on, the source voltage of main power transistor $Q_M$ may drop due the current sink or discharge path through source transistor $Q_S$ to ground. When the gate-source voltage of main power transistor $Q_M$ is greater than a conduction threshold voltage, main power transistor $Q_M$ can be on, and input voltage $V_{in}$ can be used to charge inductor L.

When the PWM control signal controls source transistor $Q_S$ to be turned off, the source voltage of main power transistor $Q_M$ may begin to rise. At this time, as the zener diode $D_{Z1}$ may not have broken through (e.g., the voltage across zener diode $D_{Z1}$ is less than the breakdown voltage), parasitic capacitor $C_{gs}$ between the gate and source of main power transistor $Q_M$ may not form a discharge circuit. The gate voltage of main power transistor $Q_M$ can be greater than the conduction threshold voltage, and main power transistor $Q_M$ may remain on. The inductor current can flow through main power transistor $Q_M$ and source diode D' can be used to charge power supply capacitor $C_H$.

With the gradual increase of the source voltage of main power transistor $Q_M$, its gate voltage may also gradually rise. When the gate voltage of main power transistor $Q_M$ reaches the breakdown voltage of zener diode $D_{Z1}$, the zener diode can be broken through and current can flow through the zener diode in a reverse direction. Parasitic capacitor $C_{gs}$ between the gate and source of main power transistor $Q_M$ can form a discharge circuit through zener diode $D_{Z1}$, and the gate voltage and the gate-source voltage of main power transistor $Q_M$ may begin to decline. When the gate-source voltage of main power transistor $Q_M$ drops to less than the conduction threshold voltage, main power transistor $Q_M$ can be turned off. For example, diode $D_1$ can be used to prevent parasitic capacitor $C_{gs}$ between gate and source of main power transistor $Q_M$ from discharging through power supply capacitor $C_H$.

It can be seen from the above described operation process that the delay circuit in this particular example can keep main power transistor $Q_M$ on for a predetermined period of time (the delay time) instead of being turned off instantly after source transistor $Q_S$ is turned off. This can allow charging of power supply capacitor $C_H$ until it is charged to a suitable supply voltage for the control circuit. In this way, the power supply capacitor can be fully charged to satisfy power for the control circuit or source driver circuitry without adding an extra capacitor between the drain and source of main power transistor $Q_M$.

Figure 3:
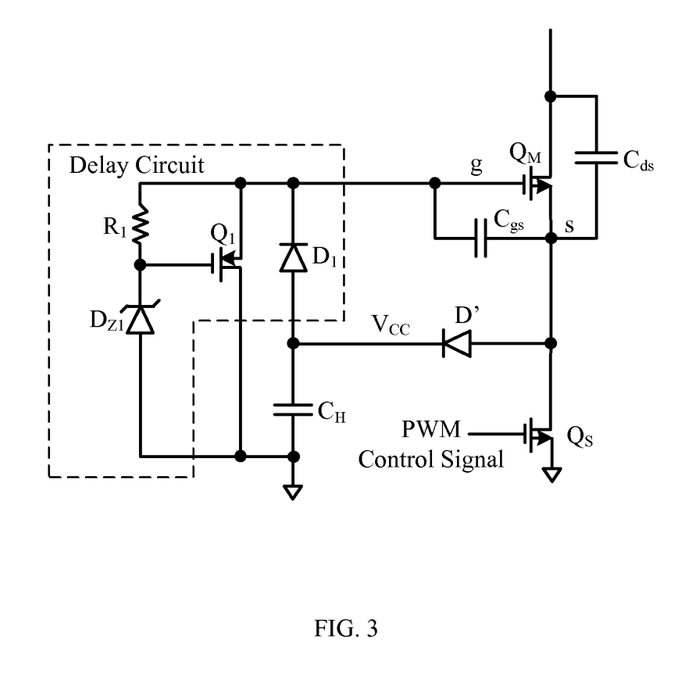
FIG. 3 is a schematic block diagram of a second example self-powered source driving circuit in accordance with embodiments of the present invention.

Referring now to FIG. 3, shown is a schematic diagram of an example self-powered source driving circuit in accordance with embodiments of the present invention. Based on the first example, the delay circuit in this particular example can also include switch $Q_1$ and resistor $R_1$. Resistor $R_1$ can connect between the negative terminal of zener diode $D_{Z1}$ and the control terminal of main power transistor $Q_M$. The first power terminal of switch or transistor $Q_1$ can connect to a common node of the resistor and the control terminal of main power transistor $Q_M$, the second power terminal of switch $Q_1$ can connect to ground, and the control terminal of switch $Q_1$ can connect to a common node of resistor $R_1$ and zener diode $D_{Z1}$.

In the present example, the breakdown voltage of zener diode $D_{Z1}$ can be a sum of the reference voltage value and the conduction threshold voltage of main power transistor $Q_M$. In other words, the breakdown voltage of zener diode $D_{Z1}$ can be a sum of the expected supply voltage of the control circuit and the conduction threshold voltage of main power transistor $Q_M$. It should be noted that switch $Q_1$ can be implemented as any suitable switch or transistor (e.g., a PNP bipolar transistor, an NPN bipolar transistor, a PMOS or P-type field effect transistor, an NMOS transistor, etc.). In the particular example as shown, switch $Q_1$ can be a P-type field effect transistor (PMOS).

The working principle of the delay circuit in this particular example is almost similar to that in the first example. Zener diode $D_{Z1}$ can be used to control main power transistor $Q_M$ to be turned off with a predetermined delay time after transistor $Q_S$ is turned off, so as to ensure power supply capacitor $C_H$ has enough charging time. Before zener diode $D_{Z1}$ is broken through, the operation process of the delay circuit is similar to the first example. A difference is that after zener diode $D_{Z1}$ is broken through, parasitic capacitor $C_{gs}$ between the gate and source of main power transistor $Q_M$ may form a discharging circuit through resistor $R_1$ and zener diode $D_{Z1}$.

Since there is a current flowing through resistor $R_1$, a voltage drop can be found across the source and gate of switch $Q_1$. When the source-gate voltage of switch $Q_1$ reaches the conduction threshold voltage, switch $Q_1$ can be turned on. At this time, parasitic capacitor $C_{gs}$ between source and gate of main power transistor $Q_M$ can be discharged through switch or transistor $Q_1$. The gate-source voltage of main power transistor $Q_M$ can be reduced gradually, and when the gate-source voltage of main power transistor $Q_M$ drops to be less than the conduction threshold voltage, main power transistor $Q_M$ can be turned off.

Therefore, as compared to the first example, this particular example can also control the main transistor to be turned off by a delay time after the transistor is turned off through the zener diode, so as to effectively charge the power supply capacitor. In addition, in this example, energy can be discharged to ground directly through the switch in order to prevent the zener diode from possibly suffering relatively high current.

Figure 4A:
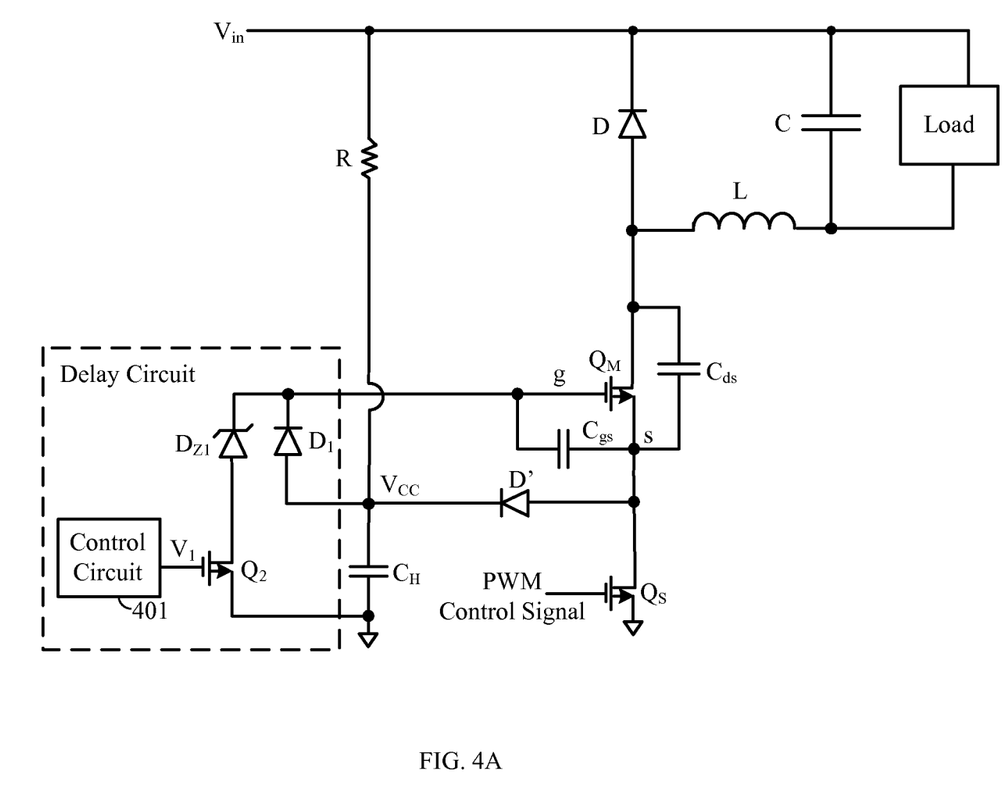
FIG. 4A is a schematic block diagram of a third example self-powered source driving circuit in accordance with embodiments of the present invention.

Referring now to FIG. 4A, shown is a schematic block diagram of a third example self-powered source driving circuit in accordance with embodiments of the present invention. The self-powered source driving circuit in this particular example can also be applied in the switching power supply with buck topology, or any other suitable topology. The delay circuit in this particular example can also include switch $Q_2$ based on the first example. In this example, the breakdown voltage of zener diode $D_{Z1}$ can be configured as the reference voltage, which may be the expected supply voltage of the control circuit. The first power terminal of switch $Q_2$ can connect to the positive terminal of zener diode $D_{Z1}$, and the second power terminal of switch $Q_2$ can connect to ground. Also, switch $Q_2$ can be turned off at any time before transistor $Q_S$ is turned off, and can be turned on when power supply capacitor $C_H$ is charged to the expected supply voltage of the control circuit.

Figure 4B:
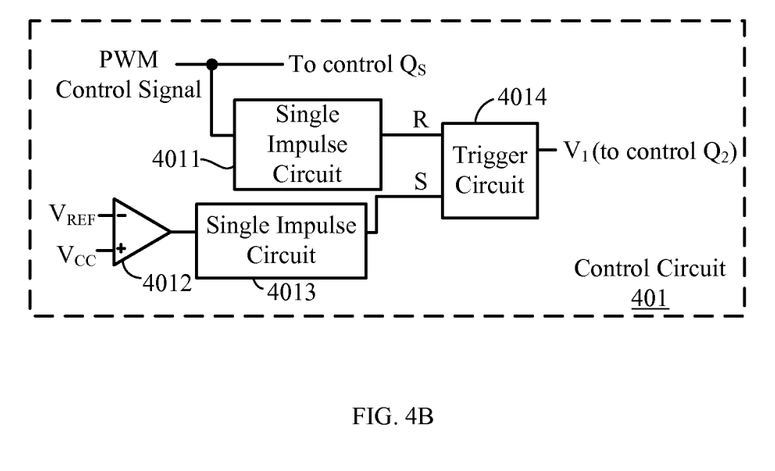
FIG. 4B is a schematic block diagram of the control circuit of FIG. 4A.

In this particular example, switch $Q_2$ can be turned off when source transistor $Q_S$ is turned on. Also shown here is control circuit 401 which can control the switching action of switch $Q_2$. FIG. 4B shows a specific circuit diagram of the control circuit shown in FIG. 4A. The control circuit can include single impulse circuit 4011, comparator 4012, single impulse circuit 4013, and flip-flop circuit 4014. Single impulse circuit 4011 can receive the PWM control signal, and generate a single impulse signal (e.g., a one-shot or a pulse signal) to flip-flop or trigger circuit 4014. The two terminals of comparator 4012 can receive voltage $V_{CC}$ across the power supply capacitor and reference voltage $V_{REF}$, and comparator 4012 can output a comparison signal through a comparison operation.

After operation of single impulse circuit 4013, the comparison signal can be converted to a single impulse signal to the flip-flop circuit through single pulse circuit 4013. For example, reference voltage $V_{REF}$ can be configured as the expected or sufficient supply voltage of control circuit 401. The flip-flop circuit can be an RS flip-flop that receives one single impulse signal as the reset (R) signal, and the other single impulse signal as the set (S) signal, and may generate control signal $V_1$ to control the switching action of switch $Q_2$. Control circuit 401 can merely be one example implementation for controlling transistor $Q_2$. However, as those skilled in the art will recognize, control of the switching action of switch $Q_2$ can also be accomplished by other suitable circuitry in certain embodiments.

Figure 4C:
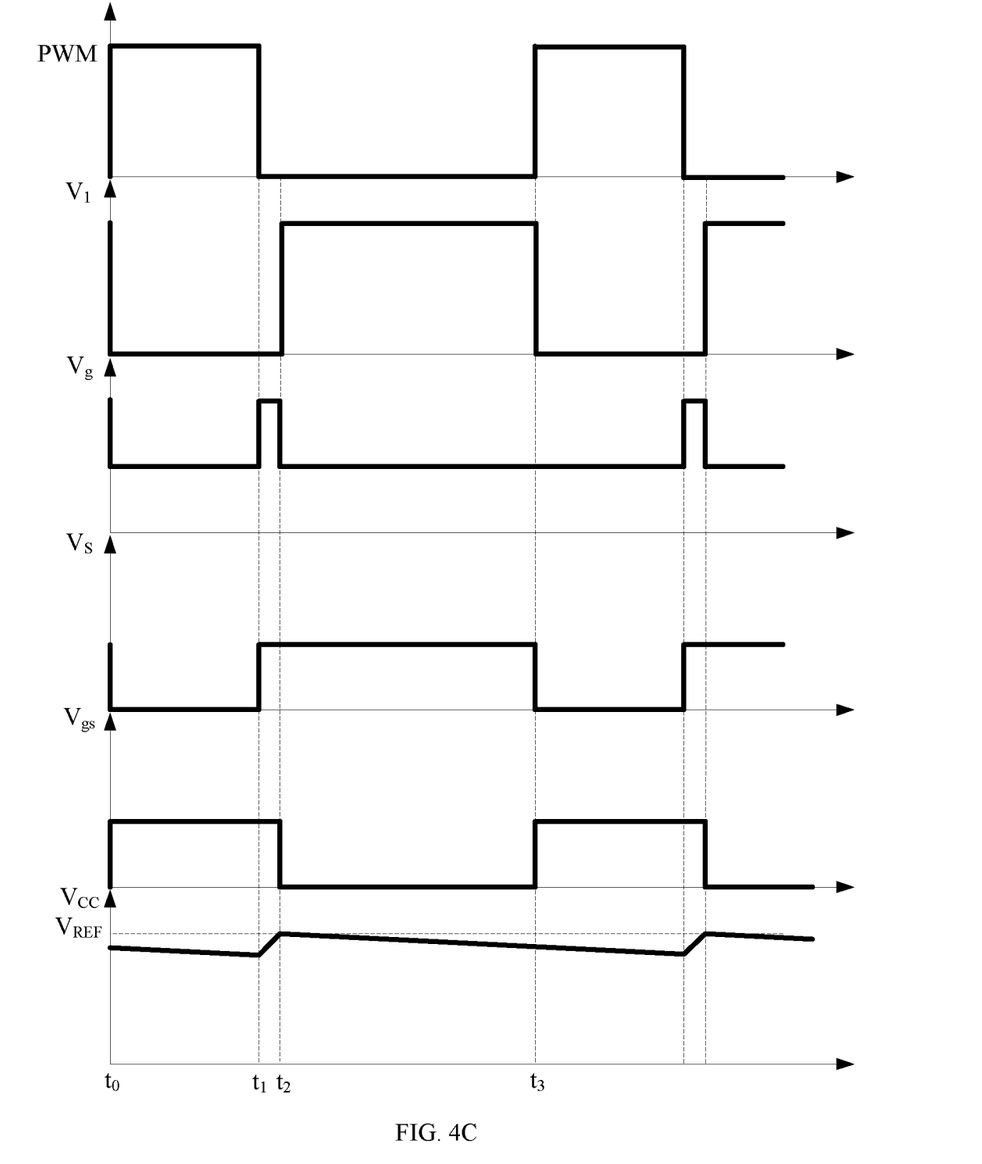
FIG. 4C is an example operational waveform diagram of the circuit of FIG. 4A.

The following further describes example operation of the source driving circuit in this particular example of FIGS. 4A and 4B, in conjunction with the example operation waveform diagram shown in FIG. 4C. At time $t_0$, the PWM control signal may go high to turn on transistor $Q_S$, and source voltage $V_S$ of main power transistor $Q_M$ can be pulled down as a result. When the gate-source voltage of main power transistor $Q_M$ is greater than the conduction threshold voltage, main power transistor $Q_M$ can be on, and input voltage can be used to charge inductor L.

The control circuit can receive the PWM control signal and may generate the single impulse signal through the signal impulse circuit, and turn off switch $Q_2$ through flip-flop or trigger circuit 4014. At time $t_1$, when the PWM control signal goes low, transistor $Q_S$ can be turned off. Also, source voltage $V_S$ of main power transistor $Q_M$ may rise to a level of voltage $V_{CC}$ across power supply capacitor $C_H$. From time $t_0$ to time $t_1$, voltage $V_{CC}$ across power supply capacitor $C_H$ may decline slightly due to the energy consumption as shown in FIG. 4C. Therefore, at time $t_1$, voltage $V_{CC}$ across power supply capacitor $C_H$ can be less than reference voltage $V_{REF}$. Also, control circuit 401 may control switch $Q_2$ to be off.

Thus, parasitic capacitor $C_{gs}$ between the gate and source of main power transistor $Q_M$ may not form a discharging circuit, and gate voltage $V_g$ may rise to, e.g., $2V_{CC}$ by capacitive coupling as source voltage $V_S$ of main power transistor $Q_M$ rises to $V_{CC}$, and main power transistor $Q_M$ remains on. As main power transistor $Q_M$ remains on, the inductor current can continue charging power supply capacitor $C_H$ through main power transistor $Q_M$ and source diode D' until voltage $V_{CC}$ reaches reference voltage $V_{REF}$. From time $t_1$ to time $t_2$ as shown in FIG. 4C, when voltage $V_{CC}$ across the power supply capacitor reaches reference voltage $V_{REF}$, the comparison signal output by comparator 4012 may go high, and control switch $Q_2$ to turn on through flip-flop circuit 4014.

As the gate voltage of main power transistor $Q_M$ may be greater than the breakdown voltage of zener diode $D_{Z1}$, zener diode $D_{Z1}$ may be broken through and current can flow in the reverse direction. Parasitic capacitor $C_{gs}$ between the gate and source of main power transistor $Q_M$ can be discharged through zener diode $D_{Z1}$ and switch $Q_2$. When the gate-source voltage of main power transistor $Q_M$ is discharged to be less than the conduction threshold voltage, main power transistor $Q_M$ may be turned off. Until the next cycle, at time $t_3$, the PWM control signal may go high to turn on transistor $Q_S$, and the source driving circuit can repeat the above described operation.

It can be seen from the above described procedure that, by turning on the switch for a predetermined delay time, the delay circuit in this particular example can control main power transistor $Q_M$ to not to be turned off at once after transistor $Q_S$ is turned off, but rather to remain on for a predetermined time to allow for charging of power supply capacitor $C_H$ until the power supply capacitor is charged to a suitable supply voltage level for the control circuit. For example, the suitable supply voltage level can be a minimum level such that the control circuit or source driver may operate, or it may be a predetermined level greater than such a minimum level.

Figure 5:
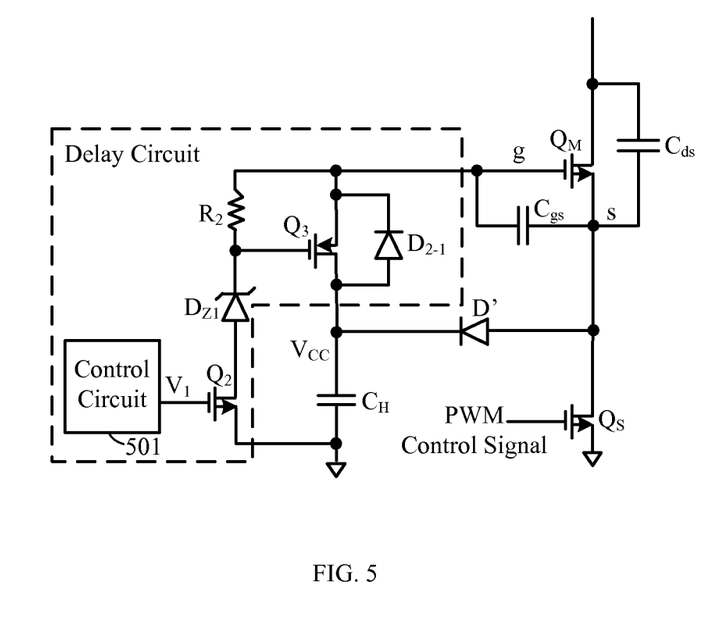
FIG. 5 is a schematic block diagram of a fourth example self-powered source driving circuit in accordance with embodiments of the present invention.

Referring now to FIG. 5, shown is a schematic block diagram of a fourth example self-powered source driving circuit in accordance with embodiments of the present invention. In this particular example, the delay circuit can include zener diode $D_{Z1}$, switch $Q_2$, and control circuit 501. Control circuit 501, as well as control circuit 601 of FIG. 6, can have a same or similar functionality to control circuit 401 as described above. The delay circuit of this example can also include switch $Q_3$ and resistor $R_2$. Resistor $R_2$ can connect in series between the control terminal of main power transistor $Q_M$ and the negative terminal of zener diode $D_{Z1}$.

The first power terminal of switch $Q_3$ (e.g., a PMOS transistor) can connect to a common node of resistor $R_2$ and the control terminal of main power $Q_M$, the power terminal of switch $Q_3$ can connect to a common node of power supply capacitor $C_H$ and source diode D', and the control terminal of switch $Q_3$ can connect to a common node of resistor $R_2$ and zener diode $D_{Z1}$. Here, parasitic diode $D_{2-1}$ of switch $Q_3$ may have the same or a similar function as that of diode $D_1$ discussed above. By controlling switch $Q_2$ to be turned on with a delay time, the delay circuit can control main power transistor $Q_M$ to not to be turned off at once after the transistor is turned off, but rather to be turned off after a delay time has elapsed. In this way, power supply capacitor $C_H$ may have sufficient charging time and charging energy to be charged, e.g., to the supply voltage of the control circuit.

In this example, when power supply capacitor $C_H$ is charged to a level of reference voltage $V_{REF}$, control circuit 501 can control switch $Q_2$ to turn on. Parasitic capacitor $C_{gs}$ between gate and source of main power transistor $Q_M$ can form a discharging circuit through resistor $R_2$, zener diode $D_{Z1}$ and switch $Q_2$. For example, as there is current flowing through resistor $R_2$, there is a voltage drop across source and gate of switch $Q_3$. When the source-gate voltage reaches the conduction threshold voltage, switch $Q_3$ can be turned on. At this time, parasitic capacitor $C_{gs}$ between gate and source of main power transistor $Q_M$ can be mainly discharged through switch $Q_3$ and power supply capacitor $C_H$, until the gate and source voltage of main power transistor $Q_M$ is less than the conduction threshold voltage, and main power transistor $Q_M$ can be turned off.

The delay circuit of this particular example can also control main power transistor $Q_M$ to turn off a delay time after transistor $Q_S$ is turned off. This can ensure full charging of power supply capacitor $C_H$, so as to avoid potential failure of the control circuit due to lack of sufficient power supply thereto. In this particular example, by discharging parasitic capacitor $C_{gs}$ between the gate and source of main power transistor $Q_M$ through switch $Q_2$ and power supply capacitor $C_H$, relatively large current flowing through zener diode $D_{Z1}$ can be avoided. Also, the power supply can be increased by discharging the energy of parasitic capacitor $C_{gs}$ to power supply capacitor $C_H$.

Figure 6:
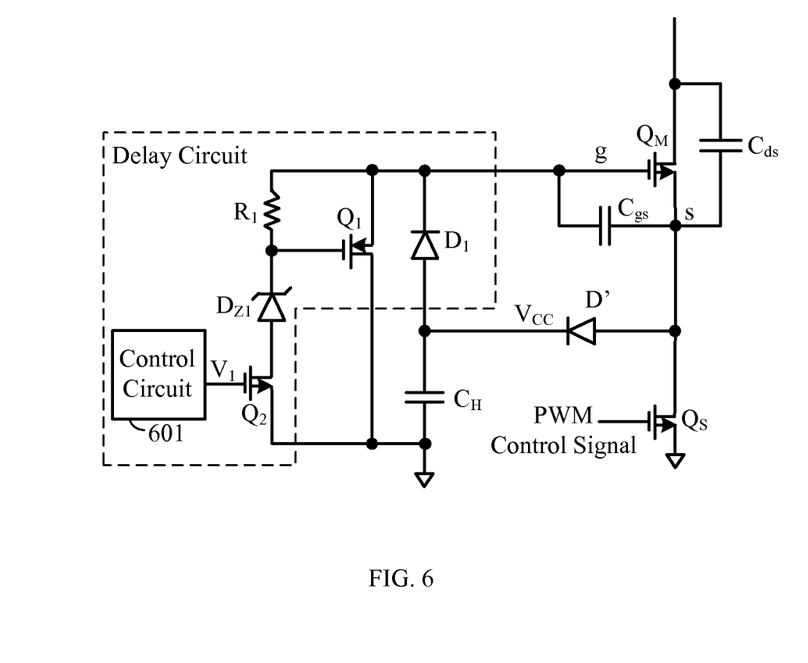
FIG. 6 is a schematic block diagram of a fifth example self-powered source driving circuit in accordance with embodiments of the present invention.

Referring now to FIG. 6, shown is a schematic block diagram of a fifth example self-powered source driving circuit in accordance with embodiments of the present invention. This particular example includes features of examples two and three discussed above. As shown in FIG. 6, the delay circuit can include zener diode $D_{Z1}$, switch $Q_2$, diode $D_1$, and control circuit 601 with a similar connection relationship as in example three. In addition, this particular example can also include switch $Q_1$ and resistor $R_1$ of example two discussed above.

Similar to example three above, by controlling switch $Q_2$ to be turned on with a delay time, the delay circuit can control main power transistor $Q_M$ not to be turned off at once after source transistor $Q_S$ is turned off, but rather to be turned off after a delay time has elapsed. In this fashion, power supply capacitor $C_H$ may have sufficient charging time and energy to be charged to the supply voltage of the control circuit. One difference in this approach is that parasitic capacitor $C_{gs}$ between gate and source of main power transistor $Q_M$ can form a discharging circuit through resistor $R_1$, zener diode $D_{Z1}$, and switch $Q_2$, after switch $Q_2$ is turned on. For example, as there is current flowing through resistor $R_1$, there is a voltage drop across the source and gate of switch $Q_1$. When the source-gate voltage reaches the conduction threshold voltage, switch $Q_1$ can be turned on. At this time, parasitic capacitor $C_{gs}$ between gate and source of main power transistor $Q_M$ can be mainly discharged through switch $Q_1$, until the gate-source voltage of main power transistor $Q_M$ is less than the conduction threshold voltage, and main power transistor $Q_M$ can be turned off.

The delay circuit of this particular example can control main power transistor $Q_M$ to be turned off with a delay time through switch $Q_1$, and to suitably charge power supply capacitor $C_H$. Also, the parasitic capacitor between the gate and source of main power transistor $Q_M$ can be directly discharged through switch $Q_1$, to avoid relatively large current possibly flowing through zener diode $D_{Z1}$.

Figure 7:
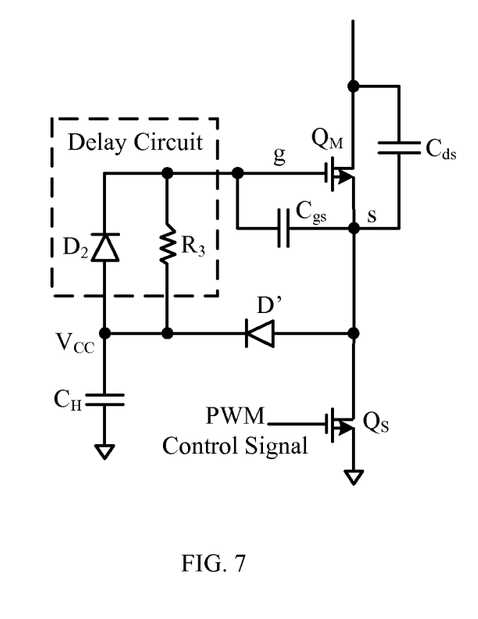
FIG. 7 is a schematic block diagram of a sixth example self-powered source driving circuit in accordance with embodiments of the present invention.

Referring now to FIG. 7, shown is a schematic block diagram of a sixth example self-powered source driving circuit in accordance with embodiments of the present invention. The delay circuit of this example can include diode $D_2$ and resistor $R_3$. The negative terminal of diode $D_2$ can connect to the control terminal of main power transistor $Q_M$, the positive terminal of diode $D_2$ can connect to a common node of power supply capacitor $C_H$ and source diode D'. Also, resistor $R_3$ and diode $D_2$ can be connected in parallel as shown in the delay circuit.

The following may describe an example operation process of the source driving circuit of this example in conjunction with FIG. 7. When the PWM control signal controls transistor $Q_S$ to turn on, the source voltage of main power transistor $Q_M$ may decline while the gate voltage thereof is about $V_{CC}$. When the gate-source voltage of main power transistor $Q_M$ is greater than the conduction threshold voltage, main power transistor $Q_M$ can be turned on. When the PWM control signal controls source transistor $Q_S$ to turn off, the source voltage of main power transistor $Q_M$ may begin to increase.

Also, parasitic capacitor $C_{gs}$ between gate and source of main power transistor $Q_M$ can be discharged through resistor $R_3$. However, the discharging speed of parasitic capacitor $C_{gs}$ between the gate and source of main power transistor $Q_M$ can be slowed due to the delay circuit formed by the resistor and the parasitic capacitor. The gate voltage of main power transistor $Q_M$ can decline slowly, and main power transistor $Q_M$ may not be turned off until the gate-source voltage of main power transistor $Q_M$ drops to less than the conduction threshold voltage. This can be done by discharging the parasitic capacitor between the gate and source, and main power transistor $Q_M$ can be turned off.

It can be seen from the above described operation process that the delay circuit of this particular example can set a value of resistor $R_3$ according to the charging time of power supply capacitor $C_H$. This can ensure that power supply capacitor $C_H$ can be charged to a suitable supply voltage for the control circuit (e.g., 401/501/601). The control scheme of this particular example represents a relatively simple and low-cost design for a source driver configured for a switching power supply.

In particular embodiments, a source driving circuit can control main power transistor $Q_M$ to be turned on when source transistor $Q_S$ is on, and to be turned off by a delay time after source transistor $Q_S$ is off. This can ensure that the power supply capacitor can be charged sufficiently to satisfy the supply voltage (e.g., $V_{CC}$), as may be required by the control circuit or source driver. A source driving circuit of particular embodiments can solve problems of insufficient power supply for the control circuit, without use of an extra capacitor.

Finally, particular embodiments can also provide a switching power supply including a power stage circuit, a control circuit, and the above described source driving circuit. The source driving circuit can receive the PWM control signal output by the control circuit to drive the main power transistor of the power stage circuit. For example, the power supply capacitor of the source driving circuit can be used to provide supply voltage for the control circuit. The voltage across the power supply capacitor can be charged to a reference voltage, and e.g., the reference voltage can be an expected supply voltage of the control circuit.

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A source driving circuit configured for a switching power circuit, the source driving circuit comprising:
   a) a source transistor coupled between a source of a main power transistor and ground, wherein said source transistor is controllable by a pulse-width modulation (PWM) control signal;
   b) said main power transistor being configured to be on when said source transistor is on and a gate-source voltage of said main power transistor exceeds a conduction threshold voltage;
   c) a source diode having an anode coupled to said main power transistor source, and a cathode coupled to a delay circuit and to a power supply capacitor, wherein said power supply capacitor is not connected to a gate of said main power transistor; and
   d) said delay circuit being coupled to said power supply capacitor and said main power transistor gate, and being configured to turn off said main power transistor after a delay time from said source transistor being turned off has elapsed, wherein said power supply capacitor is charged during said delay time such that a voltage across said power supply capacitor is at least a level of a reference voltage.

2. The source driving circuit of claim 1, wherein said delay circuit comprises:
   a) a zener diode having a cathode coupled to said main power transistor gate, and an anode coupled to ground; and
   b) a first diode having a cathode coupled to said main power transistor gate, and an anode coupled to said power supply capacitor and said source diode.

3. The source driving circuit of claim 2, wherein a breakdown voltage of said zener diode substantially equals a sum value of said reference voltage and said conduction threshold voltage of said main power transistor.

4. The source driving circuit of claim 3, wherein said delay circuit further comprises:
   a) a resistor coupled in series between said cathode of said zener diode and said main power transistor gate; and
   b) a first switch having a first power terminal coupled to said main power transistor gate, a second power terminal coupled to ground, and a control terminal coupled to a common node between said resistor and said zener diode.

5. The source driving circuit of claim 2, wherein said delay circuit further comprises:
   a) a first switch having a first power terminal coupled to said anode of said zener diode, and a second power terminal coupled to ground;
   b) said first switch being configured to be turned off before said source transistor is turned off, and said first switch being configured to be turned on when said power supply capacitor is charged to an expected supply voltage; and c) said zener diode having a breakdown voltage that is substantially equal to said reference voltage.

6. The source driving circuit of claim 5, wherein said delay circuit further comprises:
   a) a resistor coupled in series between said cathode of said zener diode and said main power transistor gate; and
   b) a second switch having a first power terminal coupled to said main power transistor gate, a second power terminal coupled to a common node between said power supply capacitor and said source diode, and a control terminal coupled to a common node between said resistor and said zener diode.

7. The source driving circuit of claim 1, wherein said delay circuit comprises:
   a) a first diode having a cathode coupled to said main power transistor gate, and an anode coupled to a common node between said power supply capacitor and said source diode; and
   b) a resistor coupled in parallel with said first diode.

8. A switching power circuit, comprising:
   a) a power stage circuit having said main power transistor;
   b) a control circuit configured to generate said PWM control signal;
   c) said source driving circuit of claim 1, wherein said source driving circuit is configured to drive said main power transistor in response to said PWM control signal; and
   d) said power supply capacitor being configured to supply voltage for said control circuit, wherein a voltage across said power supply capacitor is configured to be charged to said reference voltage that is an expected supply voltage of said control circuit.

9. The source driving circuit of claim 5, wherein said delay circuit further comprises:
   a) a first single impulse circuit configured to receive said PWM control signal, and to generate a reset signal for a flip-flop;
   b) a comparator configured to compare said reference voltage against said voltage across said power supply capacitor; and
   c) a second single impulse circuit configured to receive an output of said comparator, and to generate a set signal for said flip-flop, wherein an output of said flip-flop is configured to control said first switch.

10. A switching power circuit, comprising:
   a) a power stage circuit having said main power transistor;
   b) a control circuit configured to generate said PWM control signal;
   c) said source driving circuit of claim 5, wherein said source driving circuit is configured to drive said main power transistor in response to said PWM control signal; and
   d) said power supply capacitor being configured to supply voltage for said control circuit, wherein a voltage across said power supply capacitor is configured to be charged to said reference voltage that is an expected supply voltage of said control circuit.

11. The source driving circuit of claim 4, wherein said delay circuit further comprises:
   a) a second switch having a first power terminal coupled to said anode of said zener diode, and a second power terminal coupled to ground; and
   b) said second switch being configured to be turned off before said source transistor is turned off, and to be turned on when said power supply capacitor is charged to an expected supply voltage.

\* \* \* \* \*